US007888609B2

(12) United States Patent
Bakst et al.

(10) Patent No.: US 7,888,609 B2
(45) Date of Patent: Feb. 15, 2011

(54) MOUNTING ASSEMBLY

(75) Inventors: Lawrence E. Bakst, Sunnyvale, CA (US); Bryan Grziwok, Oakland, CA (US); Bob Musetti, Fresno, CA (US)

(73) Assignee: Pelco, Inc, Clovis, CA (US)

( * ) Notice: Subject to any disclaimer, the term of this patent is extended or adjusted under 35 U.S.C. 154(b) by 582 days.

(21) Appl. No.: 12/055,512

(22) Filed: Mar. 26, 2008

(65) Prior Publication Data

US 2008/0236887 A1 Oct. 2, 2008

Related U.S. Application Data

(60) Provisional application No. 60/920,344, filed on Mar. 26, 2007.

(51) Int. Cl.
*H05K 7/14* (2006.01)

(52) U.S. Cl. .......................................... 174/542; 16/271

(58) Field of Classification Search ................. 174/542; 16/271, 265, 266
See application file for complete search history.

(56) References Cited

U.S. PATENT DOCUMENTS

| | | | | |
|---|---|---|---|---|
| 3,666,134 | A * | 5/1972 | Rauch | 220/324 |
| 5,334,799 | A * | 8/1994 | Naito et al. | 174/17 VA |
| 5,430,248 | A * | 7/1995 | Levy | 174/50 |
| 5,783,775 | A * | 7/1998 | Marusinec | 174/50 |
| 6,121,549 | A * | 9/2000 | Korhonen | 174/66 |
| 6,730,845 | B1 * | 5/2004 | Criniti et al. | 174/67 |
| 7,105,745 | B2 * | 9/2006 | Drane et al. | 174/67 |
| 7,589,277 | B2 * | 9/2009 | Kessler et al. | 174/50 |
| 2003/0111244 | A1 * | 6/2003 | Woolsey | 174/50 |
| 2003/0172593 | A1 * | 9/2003 | Musser | 49/463 |
| 2008/0109993 | A1 * | 5/2008 | Myeong | 16/277 |

* cited by examiner

*Primary Examiner*—Hung V Ngo
(74) *Attorney, Agent, or Firm*—Paul T. Kashimba, Esq

(57) ABSTRACT

A mounting assembly comprising: a first housing portion adapted to be mounted to an object, the first housing portion having a first opening and a plurality of pins located in the opening and a first portion of a closing mechanism located on the outside of the first housing portion; and a second housing portion having a member having a plurality of slots for mating with the plurality of pins and a second portion of a closing mechanism that mates with the first portion of a closing mechanism.

13 Claims, 6 Drawing Sheets

MOUNTING ASSEMBLY

CROSS-REFERENCE TO RELATED APPLICATION

This application is related to and claims the benefit of U.S. Provisional Patent Application Ser. No. 60/920,344, filed Mar. 26, 2007, entitled SYSTEM FOR EASILY AND QUICKLY OF MOUNTING A HEAVY ENCLOSURE, the entirety of which is incorporated herein by reference.

STATEMENT REGARDING FEDERALLY SPONSORED RESEARCH OR DEVELOPMENT

N/A

BACKGROUND OF THE INVENTION

This invention relates generally to surveillance systems and, in particular, to a mounting assembly to facilitate mounting of equipment in a video surveillance system, such as wireless transmitter.

Outdoor rated enclosures are often monolithic and heavy. In many cases an installer must struggle to hold and mount a heavy monolithic enclosure to a pole, tower, wall, pendant, or other surface. The strain of installation increases the time needed to install the enclosure. These difficulties in installing video surveillance equipment are faced in numerous situations because of the environments in which much of the equipment is installed. With the advent of wireless equipment in the video surveillance industry, the installer often must mount wireless transmitters in high places requiring the use of ladders, in addition to other types of equipment. Accordingly, there has arisen a need for a system that eliminates the strain of installation and decreases the time to complete the installation.

SUMMARY OF THE INVENTION

In accordance with the present invention there is provided a mounting assembly comprising: a first housing portion adapted to be mounted to an object, the first housing portion having a first opening and a plurality of pins located in the opening and a first portion of a closing mechanism located on the outside of the first housing portion; and a second housing portion having a member having a plurality of slots for mating with the plurality of pins and a second portion of a closing mechanism that mates with the first portion of a closing mechanism.

In an alternative embodiment, the plurality of slots can have a first slot portion that runs horizontally and a second slot portion that runs vertically so that the plurality of pins mate with the plurality of slots by first sliding horizontally in the first slot portion and then moving vertically into the second slot portion. This helps to secure the second housing portion in position with the first housing portion during installation. In another alternative embodiment, the pins have a head portion located at the end of the pin so that when the plurality of slots mate with the pins, the heads prevent the member from sliding off the end of the pins, thereby helping to secure the second housing portion in position with the first housing portion during installation. The mounting assembly of the present invention can also comprise the member having a hinge so that the second housing can be rotated open and closed when it is mated with the first housing portion to facilitate the connection of electrical wires. A spring latch can also be include to provide easy locking of the two housing portions together when the installation has been completed or when the installation process is interrupted and the installer wants to protect the connectors and cables.

The present invention provides a system for making the mounting and installation of heavy enclosures easier and quicker. The system consists of a light-weight housing portion or junction box which is mounted to a pole, tower, wall, pendant, or other surface. This portion is easily handled and mounted by an installer. Electrical cables, such as power and video signals from a video camera in case where the device being mounted is a wireless transmitter, are also installed in the light-weight housing either before or after it is mounted. The main portion of the housing, which is heavy and contains the valuable electrical circuits, such as a transmitter, are then easily attached to the light-weight housing by the quick connect assembly of the present invention, thereby minimizing the installer strain and the time for installation. The present invention can be utilized, for example, with wireless transmitters such as wireless encoders or wireless bridge circuits, as well as, other equipment such as video cameras.

Other advantages and applications of the present invention will be made apparent by the following detailed description of the preferred embodiment of the invention.

DETAILED DESCRIPTION OF THE INVENTION

Figure 1:
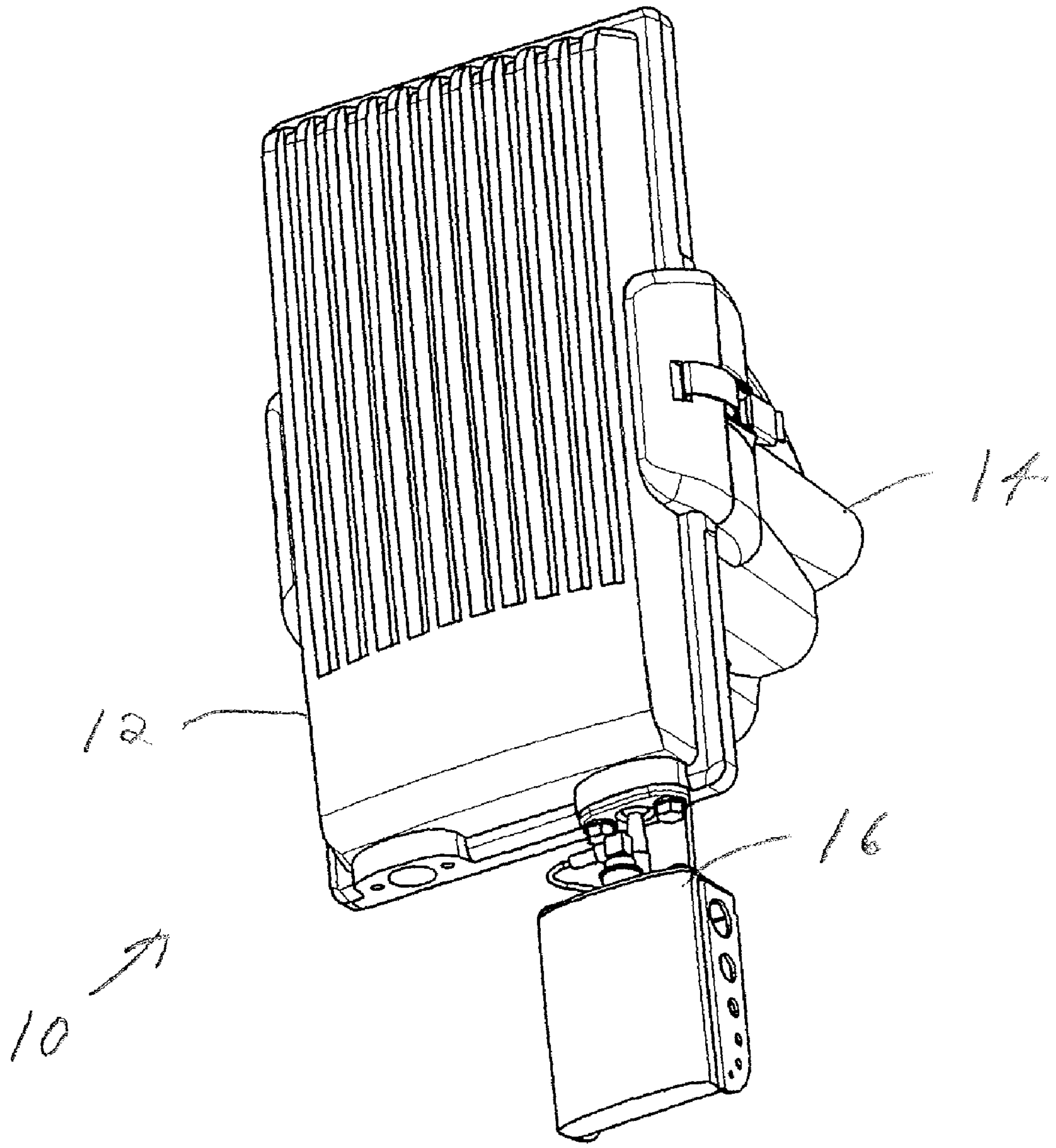
FIG. 1 is a front perspective view of one embodiment of the present invention.

FIG. 1 shows one embodiment of the present invention. In this embodiment, the mounting assembly is utilized in a transmitter 10, such as a wireless encoder for a video surveillance system. Transmitter 10 has a housing 12 that contains the electrical circuits for transmitting the video data sent to the wireless encoder from a video surveillance camera, a junction box 14 made of light-weight material and an antenna 16.

Figure 2:
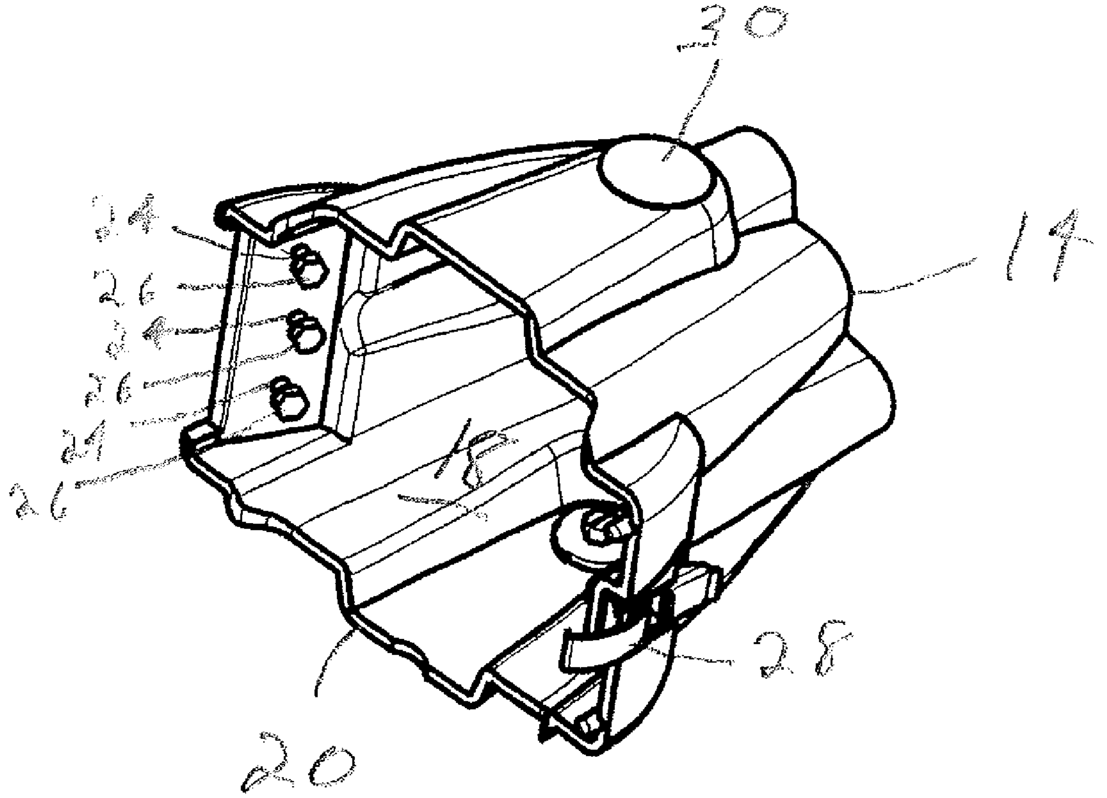
FIG. 2 shows one embodiment of a first portion of the mounting assembly of the present invention shown in FIG. 1.
Figure 3:
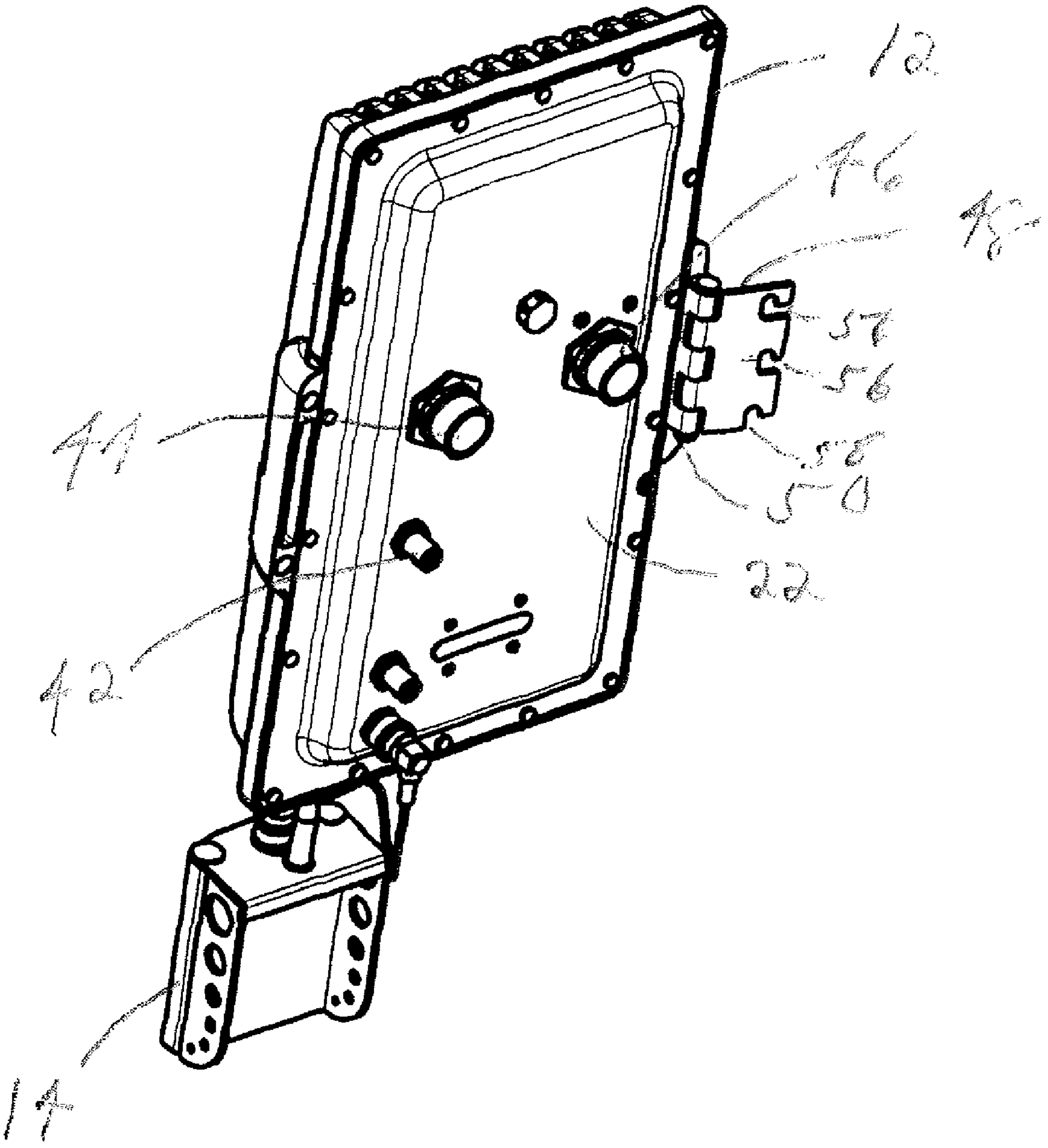
FIG. 3 shows one embodiment of a first portion of the mounting assembly of the present invention shown in FIG. 1.
Figure 4:
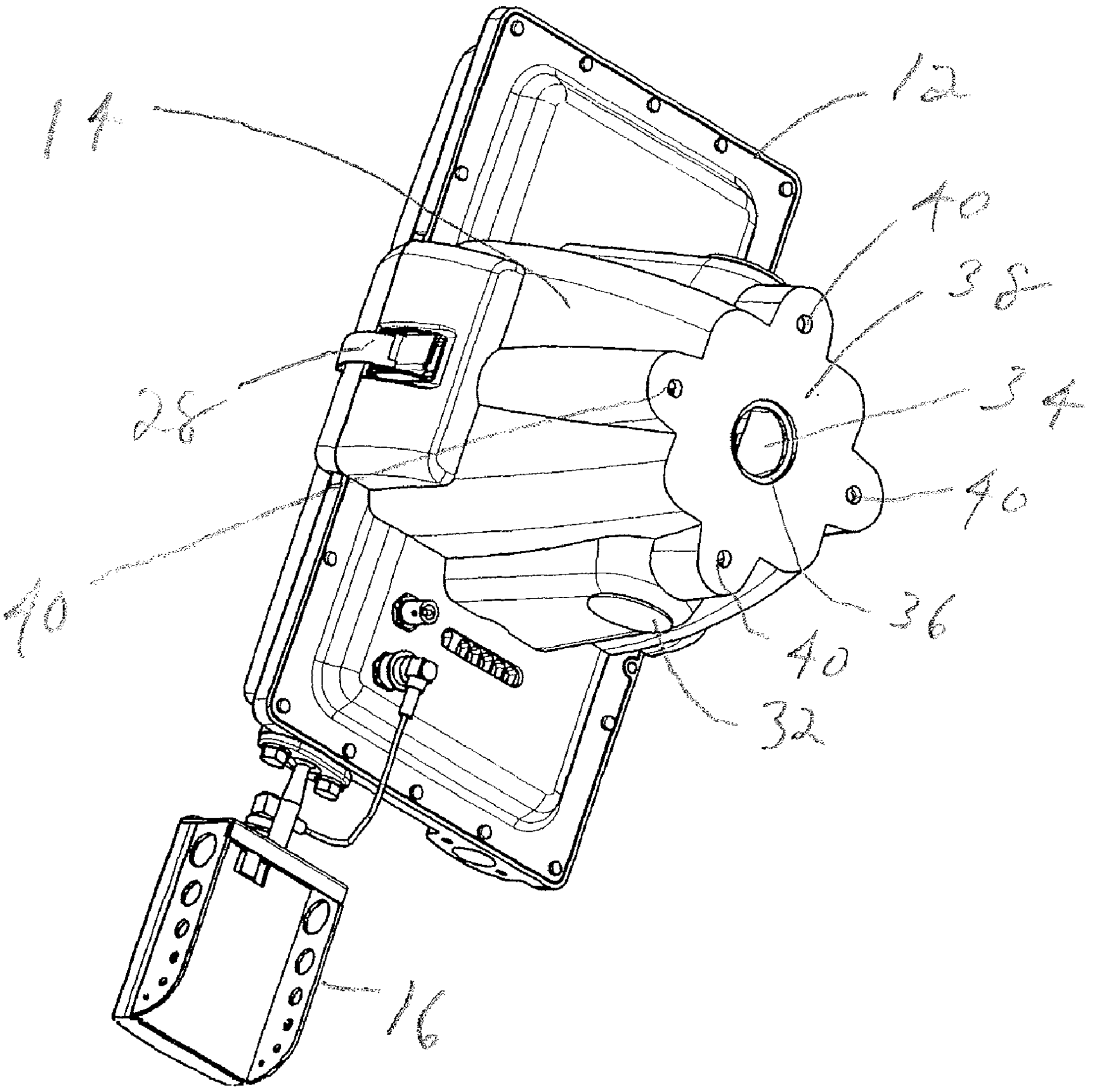
FIG. 4 is a back perspective view of the embodiment shown in FIG. 1.

Referring to FIGS. 2 and 3, junction box 14 has an aperture 18 in one end surrounded by an edge 20 which mates with surface 22 of housing 12 when the assembly of the present invention is disclosed. Junction box 14 has a plurality of pins 24 with heads 26 located inside aperture 18. A spring latch 28 is located on the outside of junction box 14. The top portion of junction box 14 has an aperture for providing wires into junction box 14. In FIG. 2, this aperture is shown as being closed by screw plug 30 which mates with threads in junction box 14. FIG. 4 shows a similar aperture on the bottom of junction box 14 with a screw plug 32 located therein. Aperture 34 located in the back 38 of junction box is shown without a screw plug. Threads in junction box 14 are indicated by numeral 36. Back 38 can also have a plurality of apertures 40 to accommodate bolts or screws for mounting of junction box 14 to a pole, tower, wall, pendant, or other surface.

Figure 5:
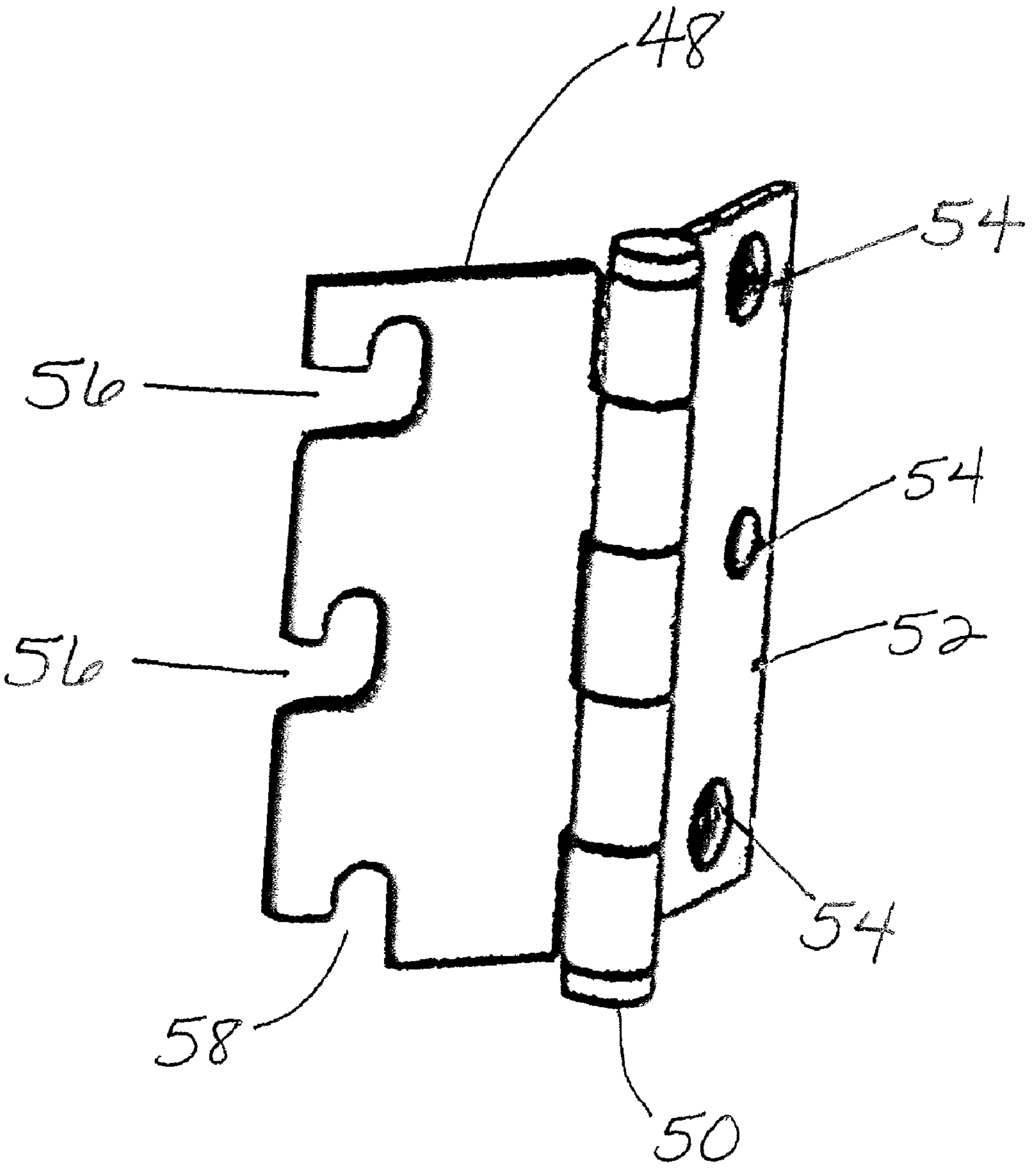
FIG. 5 shows one embodiment of a mounting member utilized in the present invention.

Surface 22 of housing 12 has a plurality of electrical connectors 42, 44, and 46 positioned so that when transmitter 10 is assembled, electrical connectors 42, 44 and 46 are located inside aperture 18 of junction box 14. A member 48 is connected to housing 12 by a hinge 50 connected to member 52. FIG. 5 shows the arrangement of members 48 and 52 with hinge 50. Member 52 has a plurality of holes 54 for connecting member 52 to housing 12 by means of screws or the like, not shown. Member 52 has a plurality of slots 56 having a horizontal portion and vertical portion. Member 52 also has a slot 58 located at the bottom of member 52 so that the horizontal portion of the slot is missing and only the vertical portion of the slot has two sides. Slot 58 can facilitate mating of housing 12 with junction box 14.

Figure 6:
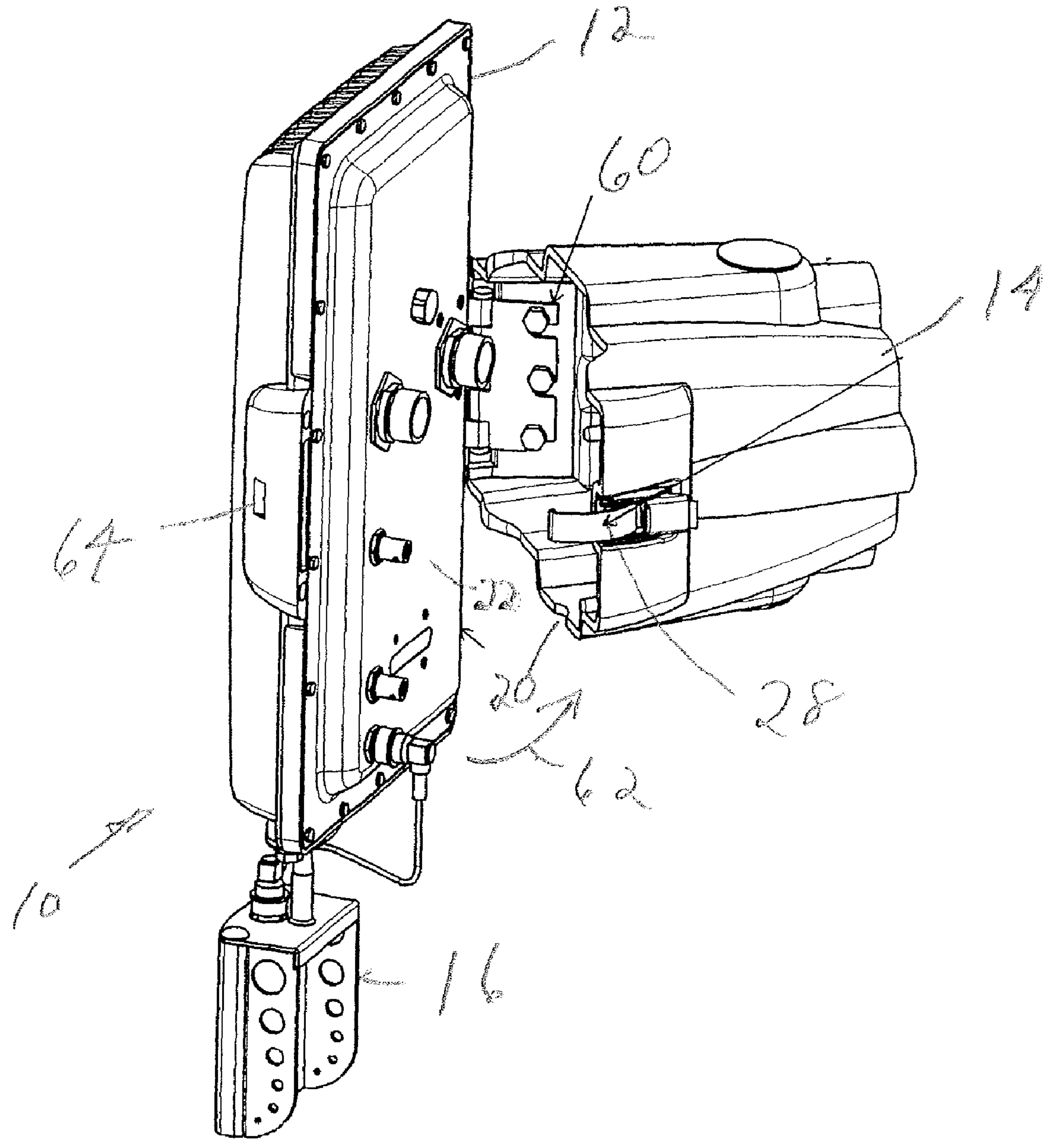
FIG. 6 illustrates the operation of the mounting assembly of the present invention.

After junction box 14 has been mounted to a pole, tower, wall, pendant, or other surface, housing 12 is then placed in to position by sliding pins 24 into slots 56 and 58 horizontally and then vertically to secure housing 12 in position. FIG. 6 indicates the final position by numeral 60. Heads 26 of pins 24 are sized so that they are larger than slots 56 and 58 to prevent member 48 from coming off of pins 24. Transmitter 10 is closed by rotating housing 12 in the direction of arrow 62 so that surface 22 mates with edge 20. Latch 28 mates with aperture 64 in housing 12 to securely close transmitter 10.

It is to be understood that variations and modifications of the present invention can be made without departing from the scope of the invention. It is also to be understood that the scope of the invention is not to be interpreted as limited to the specific embodiments disclosed herein, but only in accordance with the appended claims when read in light of the foregoing disclosure.

What is claimed is:

1. A mounting assembly comprising: a first housing portion adapted to be mounted to an object, said first housing portion having a first opening and a plurality of pins located in said opening and a first portion of a closing mechanism located on the outside of said first housing portion; and a second housing portion and having a member having a plurality of slots for mating with the plurality of pins and a second portion of a closing mechanism that mates with said first portion of a closing mechanism.

2. A mounting assembly as recited in claim 1 wherein said plurality of slots are shaped so that said plurality of pins slide into said slots.

3. A mounting assembly as recited in claim 2 wherein said plurality of slots have a first slot portion that runs horizontally and a second slot portion that runs vertically so that said plurality of pins mate with said plurality of slots by first sliding horizontally in said first slot portion and then moving vertically into said second slot portion.

4. A mounting assembly as recited in claim 3 wherein said second slot portions of said slot have an upper wall and said plurality of pins are adjacent the upper wall of said second slot portions.

5. A mounting assembly as recited in claim 4 wherein said pins have an end and have a head portion located at said end so that when said plurality of slots mate with said pins, the heads of said pins prevent said member of sliding off said end of said pins.

6. A mounting transmitter assembly as recited in claim 5 wherein said member is connected to said second housing by a hinge.

7. A mounting assembly as recited in claim 6 wherein said second portion of said closing mechanism is a latch and said first portion of said closing mechanism is an aperture that mates with said latch.

8. A mounting assembly as recited in claim 1 wherein said first housing portion has an edge that surrounds said opening and wherein said second housing portion has a surface that that mates with said edge of said first housing portion and wherein said second housing portion has an electrical connector located on said surface so that when said surface mates with said edge said electrical connector is located inside said opening.

9. A mounting assembly as recited in claim 6 wherein said first housing portion has an edge that surrounds said opening and wherein said second housing portion has a surface that that mates with said edge of said first housing portion and wherein said second housing portion has an electrical connector located on said surface so that when said surface mates with said edge said electrical connector is located inside said opening.

10. A mounting assembly as recited in claim 9 further comprising an antenna attached to said second housing portion.

11. A mounting assembly as recited in claim 1 wherein said first portion of said closing mechanism is a latch and said second portion of said closing mechanism is an aperture that mates with said latch.

12. A mounting assembly as recited in claim 1 further comprising an antenna attached to said first housing portion.

13. A mounting assembly as recited in claim 1 further comprising an antenna attached to said second housing portion.

* * * * *